United States Patent
Gao

(10) Patent No.: US 11,800,680 B2
(45) Date of Patent: Oct. 24, 2023

(54) SYSTEMS AND DEVICES FOR ASYNCHRONOUS OPERATION IN A SERVER CHASSIS FOR MINIMIZING COOLING LIQUID LEAKAGE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 16 days.

(21) Appl. No.: 17/355,617

(22) Filed: Jun. 23, 2021

(65) Prior Publication Data

US 2022/0418158 A1    Dec. 29, 2022

(51) Int. Cl.
*H05K 7/20*    (2006.01)
*G06F 1/20*    (2006.01)

(52) U.S. Cl.
CPC ..... *H05K 7/20272* (2013.01); *H05K 7/20281* (2013.01); *G06F 1/20* (2013.01)

(58) Field of Classification Search
None
See application file for complete search history.

(56) References Cited

U.S. PATENT DOCUMENTS

| | | | |
|---|---|---|---|
| 2011/0056674 A1* | 3/2011 | Campbell | H05K 7/2079 165/104.31 |
| 2016/0270259 A1* | 9/2016 | Chainer | G01M 3/3227 |
| 2018/0084676 A1* | 3/2018 | Edwards | F04D 13/12 |
| 2018/0131128 A1* | 5/2018 | Franz | H01R 13/5219 |
| 2022/0071063 A1* | 3/2022 | Heydari | H05K 7/20836 |
| 2022/0087075 A1* | 3/2022 | Heydari | G06N 3/063 |
| 2022/0110223 A1* | 4/2022 | Heydari | H05K 7/20836 |
| 2022/0151114 A1* | 5/2022 | Heydari | H05K 7/20272 |

* cited by examiner

*Primary Examiner* — Courtney L Smith
(74) *Attorney, Agent, or Firm* — WOMBLE BOND DICKINSON (US) LLP

(57) ABSTRACT

A system for managing liquid leakage comprises a fluid module, which includes a supply fluid connector to receive cooling fluid from a rack manifold coupled to an external fluid source and to supply the cooling fluid to an information technology (IT) load of the server chassis, and a return fluid connector to receive cooling fluid from the IT load of the server chassis and to return the cooling fluid to the rack manifold and then to the external fluid source, forming a fluid loop, packaged with different energy storage units. When a liquid leakage is detected by a sensor in the server chassis, an electromagnetic unit coupled to the supply and return fluid connectors causes the first fluid connector to be pushed away from the rack manifold to disconnect the fluid loop on a supply side, and causes the return fluid connector to be disconnected from the rack manifold on a return side after a predetermined period of time after the supply fluid connector has been disconnected.

20 Claims, 6 Drawing Sheets

SYSTEMS AND DEVICES FOR ASYNCHRONOUS OPERATION IN A SERVER CHASSIS FOR MINIMIZING COOLING LIQUID LEAKAGE

FIELD OF THE INVENTION

Embodiments of the present disclosure relate generally to cooling systems. More particularly, embodiments of the disclosure relate to a system and method for removing liquid leakage in a server chassis.

BACKGROUND

Data centers continue to pack more computing power into smaller spaces to consolidate workloads and accommodate processing-intensive applications, such as artificial intelligence (AI) and advanced analytics. As a result, each rack consumes more energy and generates more heat, putting greater pressure on cooling systems to ensure safe and efficient operations.

Liquid cooled systems have been increasingly popular for the thermal management needs of data centers, because it can conduct heat better than air, and therefore can handle a data center's growing densities effectively and accommodate computer-intensive applications. Further, compared with air cooling, liquid cooling can consume less energy, use less water, take up less space, and produce less noise.

However, liquid leakage detection and management in such liquid cooled system have been unsatisfying. Existing solutions tend to focus on cutting off fluid systems, while ignoring servers, where leaked liquid can cause damages. The leakage is a major challenge for liquid cooling solutions deployed on a large scale. It is increasingly important to develop proper leakage detections and treatment solutions.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
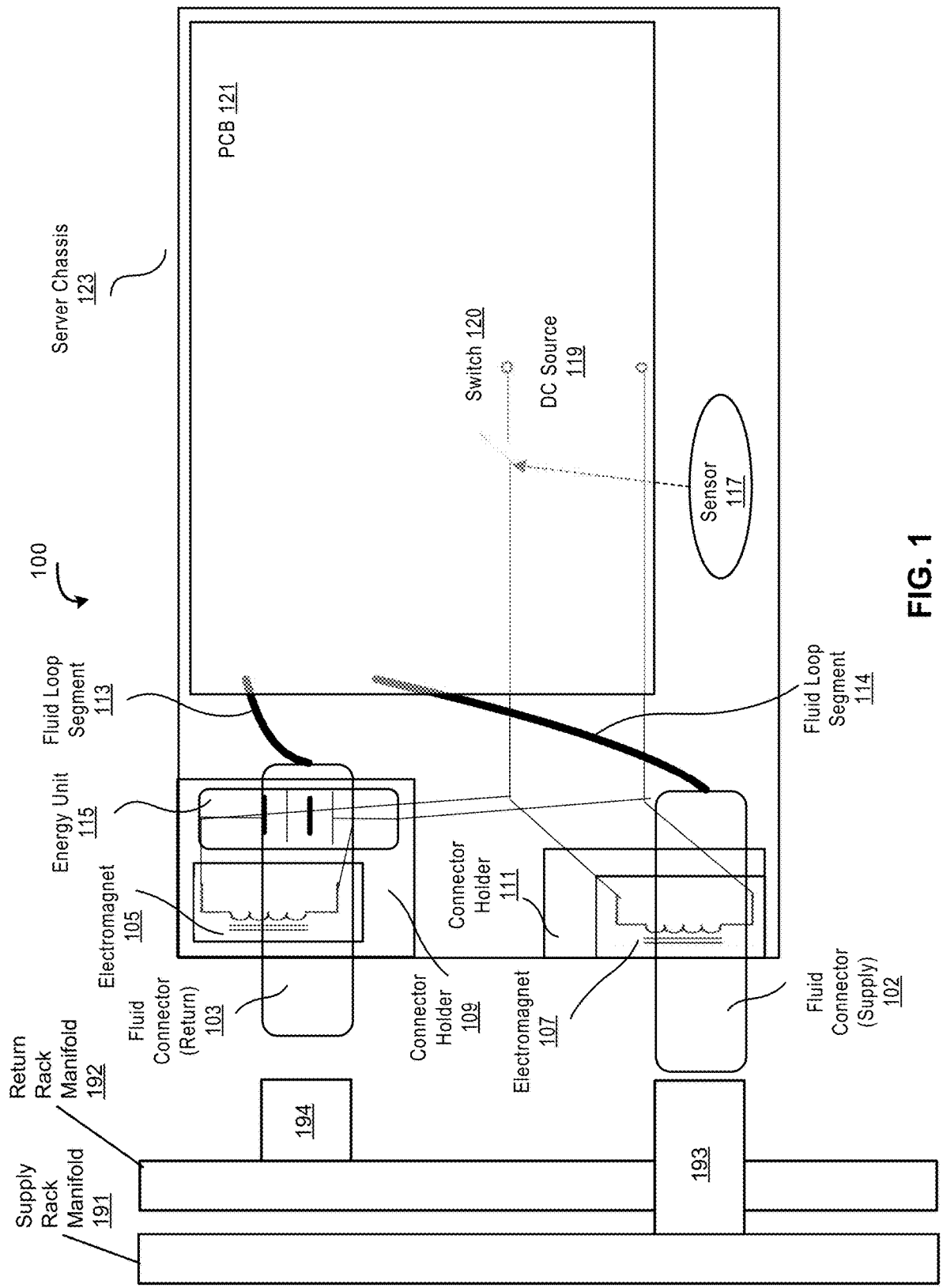
FIG. 1 illustrates a system for fluid leakage management in a server chassis according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to various embodiments, described herein are systems and hardware designs for managing liquid leakage in a server chassis populated into a server rack. In one embodiment, a system for managing liquid leakage in a server chassis includes a fluid module, which further includes a first fluid connector to receive cooling fluid from a supply rack manifold coupled to an external fluid source and to supply the cooling fluid to an information technology (IT) load of the server chassis, and a second fluid connector to receive cooling fluid from the IT load of the server chassis and to return the cooling fluid to a return rack manifold and then to the external fluid source, forming a fluid loop. The system further includes a sensor coupled to the server chassis. The sensor is configured to detect a liquid leakage from the fluid loop in the server chassis. The system further includes an electromagnetic unit coupled to the first and second fluid connectors. Upon detecting the liquid leakage, the electromagnetic unit causes the first fluid connector to be pushed away from the supply rack manifold to disconnect the fluid loop on a supply side, and the electromagnetic unit further causes the second fluid connector to be disconnected from the return rack manifold on a return side after a predetermined period of time after the first fluid connector has been disconnected.

In one embodiment, the electromagnetic unit includes a first electromagnetic device coupled to the first fluid connector, and a second electromagnetic device coupled to the second fluid connector. Each of the first electromagnetic device and the second electromagnetic device comprises an electromagnet, and is to push its corresponding fluid connector towards or away from the corresponding rack manifold individually based on whether the respective electromagnetic device is being powered.

In one embodiment, upon detecting the liquid leakage, the first electromagnetic device is cut off from a direct current (DC) source to cause the first fluid connector to be pushed away, due to loss of magnetic force, from the supply rack manifold to disconnect the fluid loop on the supply side, and the second electromagnetic device continues to be powered by the DC source to keep the second fluid connector connected to the server chassis on the return side.

In one embodiment, the system further includes an energy storage unit coupled to the DC source that is to recharge the energy storage unit when the DC source is connected to the fluid module. Upon detecting the liquid leakage, the first electromagnetic device is cut off from the DC source to cause the first fluid connector to be pushed or pulled away from the supply rack manifold to disconnect the fluid loop on the supply side, and the second electromagnetic device continues to be powered by the energy storage unit to keep the second fluid connector connected to the server chassis on the return side.

In one embodiment, the fluid module further includes a first connector holder, and a second connector holder. The first connector holder holds the first electromagnetic device, the first fluid connector, and the second connector holder holds the second electromagnetic device, the second fluid connector, and an energy storage unit.

In one embodiment, the first connector holder holds the first electromagnetic device and the first fluid connector, and the second connector holder holds the second electromagnetic device and the second fluid connector. The energy storage unit is provided as separate energy storage unit that is added to the fluid return side in this design, either a combined module or separate module.

In one embodiment, the first electromagnetic device and the second electromagnetic device is powered by a same DC source. In another embodiment, they can be powered by two difference DC sources. The DC source that powers the first electromagnetic device has a switch that can switch on and switch off the DC source, and the DC source that powers the second electromagnetic device does not have switch.

In one embodiment, the sensor is coupled to the server chassis via a communication port, wherein the sensor is to control the switch via a baseboard management controller (BMC).

The embodiments described above are not exhaustive of all aspects of the present invention. It is contemplated that the invention includes all embodiments that can be practiced from all suitable combinations of the various embodiments summarized above, and also those disclosed further below.

The various embodiments of the disclosure provide a linkage management solution on the server side. This solution can improve the overall reliability of liquid cooling by ensuring fluid running to IT components with critical servers and edge servers. The embodiments can provide designs that can be used for any types of servers or rack architectures by modularizing the leakage management system and by using common interfaces. Further, the embodiments provide an interoperable solution that decreases additional customization to meet different requirements.

FIG. 1 illustrates a system 100 for fluid leakage management in a server chassis according to one embodiment. As shown in FIG. 1, the fluid leakage management system 100 includes a pair of fluid connectors 102 and 103, an electromagnetic device having a pair of electromagnets 107 and 105, and an energy storage unit 115.

The leakage management system 100 further includes a pair of connector holders 111 and 109. The connector holder 111 can hold and clasp the electromagnet 107 and the fluid connector 102. The connector holder 109 can hold and clasp the fluid connector 104, the electromagnet 105, and the energy storage unit 115. In one design, the fluid connectors 102 and 103 are one-sided blind mating connectors, which perform the mating action via a sliding or snapping action that can be accomplished without wrenches or other tools. Further, both the fluid connector 102 and fluid connector 103 have self-aligning features which allows a small misalignment when mating.

In one embodiment, each of the of the electromagnets 105 and 107 can be a device consisting of a core made of bar of iron or other ferromagnetic material, which is surrounded by a coil of wire through which an electronic current is passed to magnetize the core.

In FIG. 1, the first fluid connector 102 and the second fluid connector 103 are assembled to the server chassis 123, with a complete fluid loop formed to allow liquid to pass through the cooling loop in the server chassis 123 to cool the electronic components on a PCB 121. Thus, in a normal operation, which means that there is no liquid leakage is detected by a leakage detection senor 117, the supply side electromagnet 107 can be directly powered by a direct current (DC) power source 119, and the return side electromagnet 105 can also be powered by the DC source 119. Additionally, the return side electromagnet 107 is coupled to the energy storage unit 115, which can be a rechargeable battery that can be recharged by the DC source 119.

Electromagnets 105 and 107 are fixed attached to connectors 102-103 respectively. When there is a power supplied to electromagnets 105 and 107, due to the magnetic force, the electromagnets 105 and 107, together with the connectors 102-103, are attracted to a rear panel of server chassis 123 towards supply rack manifold 191 and return rack manifold 192. In this configuration, server connector 103 is connected or engaged (e.g., mated) with rack connector 194, while server connector 102 is connected or engaged with rack connector 193. The cooling fluid is supplied from supply rack manifold 191, via connected connectors 193 and 102 to the cooling plates of electronic devices disposed on PCB 121. The cooling fluid is then returned from the cooling plates, via the connected connectors 103 and 194, back to return rack manifold 192.

In one embodiment, the leak detection sensor 117 can use the scattering of infrared light via photo-refraction to detect the presence of liquid regardless of viscosity, reflectivity, or color of the liquid.

Upon detecting the occurrence of a liquid leakage of the fluid loop occurs within the server chassis 123, a controller coupled to the leakage detection sensor 117 can immediately switch off a power circuit for the electromagnets 105 and 107, which would cause the DC source 119 to be cut off immediately for both electromagnets 105 and 107.

In one embodiment, the DC source 119 can also be cut off by cutting off the power supply to the whole server chassis 123. In another embodiment, the DC source 119 can be cut off using a switch 120, who is controlled by the leakage detection sensor 117.

When the DC source 119 is cut off, the magnetic field/force is to disappear. The disappearance of the magnetic field, coupled to mechanical configurations at the fluid connector 102, can cause a disconnection of the fluid loop on the supply side. In one embodiment, the electromagnet 107 can cause the fluid connector 102 to move horizontally to the right to disconnect the fluid loop on the rack supply manifold.

Note that, although not shown, in one embodiment, there is a spring structure disposed between electromagnet 107 and the rear panel of server chassis 123 and between electromagnet 105 and the rear panel of server chassis. Typically, the chassis container is made of metal and the electromagnets 105 and 107 are attracted to the rear panel due to the magnetic force when the power is supplied to electromagnets 105 and 107, which compress the sprint structures. When the power is cut off from electromagnet 107, due to the loss of magnetic force, electromagnet 107 is no longer attracted to the rear panel of the server chassis. In response, the spring structure is released or decompressed, which pushes electromagnet 107, together with connector 102 away from supply rack manifold 191. As a result, server connector 102 is disconnected from rack connector 193. Electromagnet 105 and connector 103 work in the same manner.

However, on the return side, the moment that the DC source 119 is cut off, the energy storage unit 115, which is coupled to the electromagnet 105, start to function to continuously power the electromagnet 105 for a predetermined period of time (e.g., 30 seconds) such that the electromagnet 105 does not lose its magnetic field. The continued presence of the magnetic field can keep the fluid connect 103 connected with rack connector 194 on the return side for the predetermined period of time, during which the leaked liquid can be cleaned up. For example, the leaked liquid can be pumped out using a pump, which may be turned on as soon as the liquid leakage is detected.

The leaked liquid in the server chassis 123 can damage electronic components in an incident server where the liquid leakage occurs, as well as electronic components in one or more servers underneath the incident server, particularly when the underneath servers are not fully sealed. Thus, a timely cleaning up of the leaked liquid can avoid the above-described damages.

In one embodiment, at the expiration of the predetermined period of time, the energy storage unit 115 can stop powering the electromagnet 105. Without any power, the electromagnet 105 can cause the fluid connector 103 to be disconnected from rack connector 194 of return rack manifold 192 and the external source. Such a disconnection can prevent air from entering the external loop to cause pump cavitation.

In one embodiment, the period of time can be determined as follows: Assume that the total amount of fluid volume is V_fluid, which is determined based on design specifications of the system 100; that the fluid flow rate is M ($m^3$/s); and that maximum system flow rate is M_max ($m^3$/s). Then, the theoretical total amount of the time needed for completely cleaning up the leaked liquid within the system 100 can be t=V_fluid/M_max. Therefore, the time t would be the time needed for the return side to be connected after the supply side disconnection. The time t can also be used to determine actual specifications of the energy storage unit 115.

Figure 2:
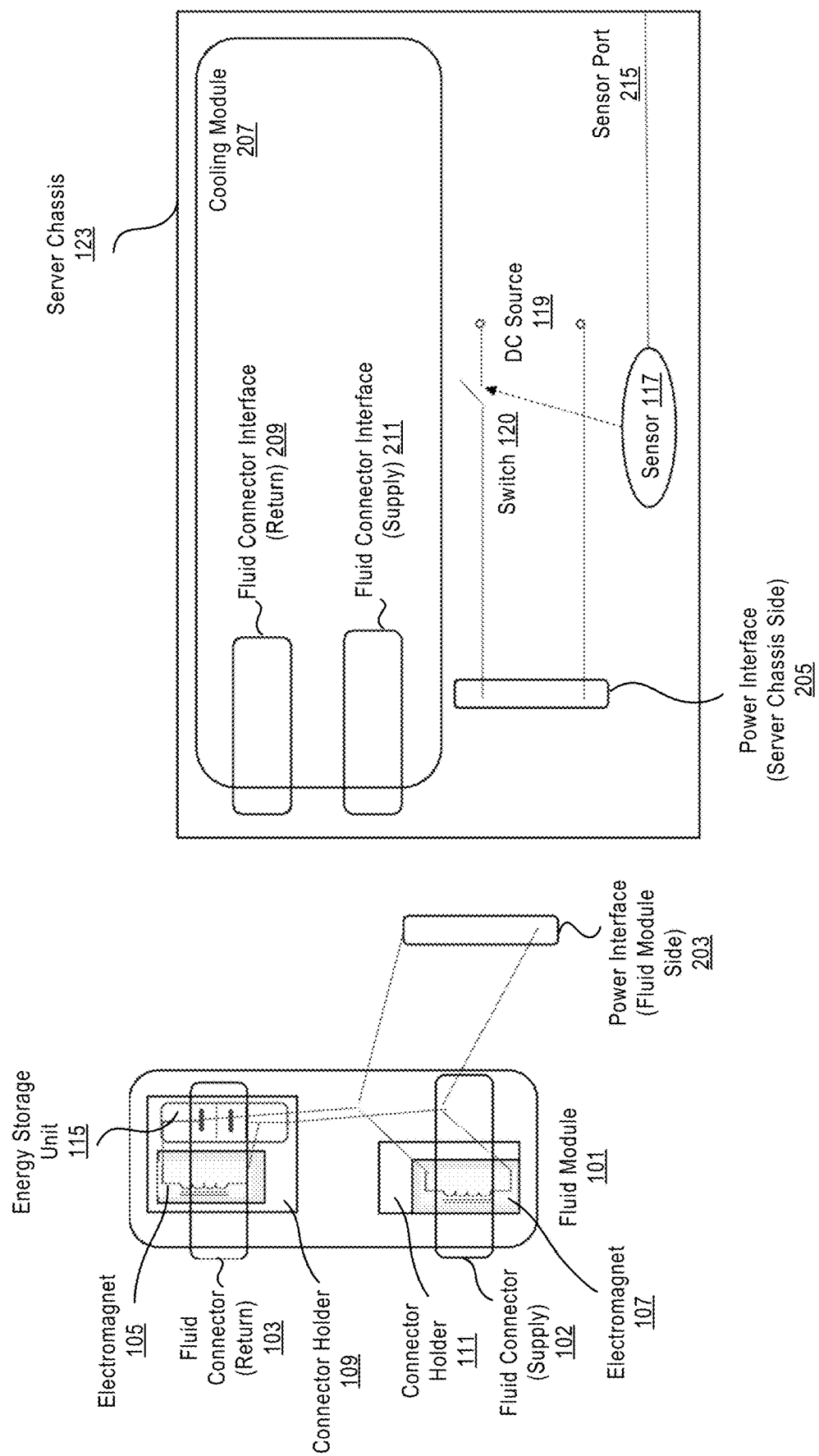
FIG. 2 further illustrates the system for fluid leakage management according to one embodiment.

FIG. 2 further illustrates the system 100 for fluid leakage management according to one embodiment. More specifically, in FIG. 2, a fluid module 101 is introduced where the fluid connectors 102 and 103, the connector holders 111 and 109, the electromagnets 107 and 105, as well as the energy storage unit 115 are assembled in. This embodiment shows the fluid module 101 before it is assembled to the server chassis 123, and power interface components 203 mating with 205, and fluid interfaces 102 and 103 mating with 209 and 211 for assembling the fluid module 101.

As shown, each of the fluid module 101 and the server chassis 123 can include a common power interface. For example, the fluid module 101 can include the power interface 203, and the server chassis 123 can include the power interface 205.

As further shown, the cooling module 207 in the server chassis 123 can include a pair of fluid connector interfaces 209 and 211 that correspond to the fluid connector 103 and the fluid connector 102 respectively.

In FIG. 2, the fluid module 101 is a complete module which can be added to a cooling module 207 in the server chassis 123. In one embodiment, the fluid connector 102 is a double-sided connector, with one side used for connecting to the cooling module 207 in the server chassis 123, and the other side used for connecting to an external loop connector (e.g., rack connector 193 of supply rack manifold 191) to enable fluid to enter the cooling module 207 via the fluid connector 102 and the fluid connector interface 211 that are mated together.

Similarly, the fluid connector 103 is a doubled-sided connector, with one side used for connecting an external loop connector (e.g., rack connector 194 of return rack manifold 192), and the other side used for connecting the fluid loop to the cooling module 207 on the return side such that fluid can exit the cooling module 207 through the fluid connector interface 209 and the fluid connector 103 that are mated together.

The fluid connector 102 is assembled in the fluid module 101, with one side connecting to the external supply source via supply rack manifold 191 and the other side connecting to the fluid connector interface 211. The fluid connector 103 is assembled in the fluid module 101, with one side connecting to the external return source via return rack manifold 192 and one side connecting to the fluid connector interface 209. In one design, the fluid connectors 102 and 103 are blind mating connectors on one side, manual mating on the other side. In one design, the fluid connector 102 and 103 are blind mating connectors on both sides.

The pair of fluid connectors interfaces 209 and 211, and the power interface 205 enable the prebuilt fluid module 101 to be assembled with the server chassis 123, including connecting the DC source 119 to the fluid module 101, and engaging the fluid connectors 103 and 102 to the fluid connector interfaces 209 and 211.

As used herein, engaging a fluid connector is to mate the fluid connector with a corresponding interface. In one embodiment, the engagement of the fluid connectors 103 and 102 can be caused by the corresponding electromagnets 105 and 107 respectively. Each of the electromagnets 105 and 107, with an electronic current passing through, can generate a force, pushing the associated fluid connectors horizontally towards the cooling module 107, thus engaging the fluid connectors 103 and 102.

In an alternative embodiment, each of the electromagnets 105 and 107 can be replaced by a mechanical device, such as a motor.

Thus, the fluid module 101 and the sever chassis 123, when assembled together, can include fluid connections, structural integrations, power connections, and controls. The controls can be prebuilt on the server chassis 123. For example, as part of the controls, the liquid leakage detection sensor 117 can be connected to the server chassis 123 via a sensor port 215, and can be used to control the switch 120.

Figure 3:
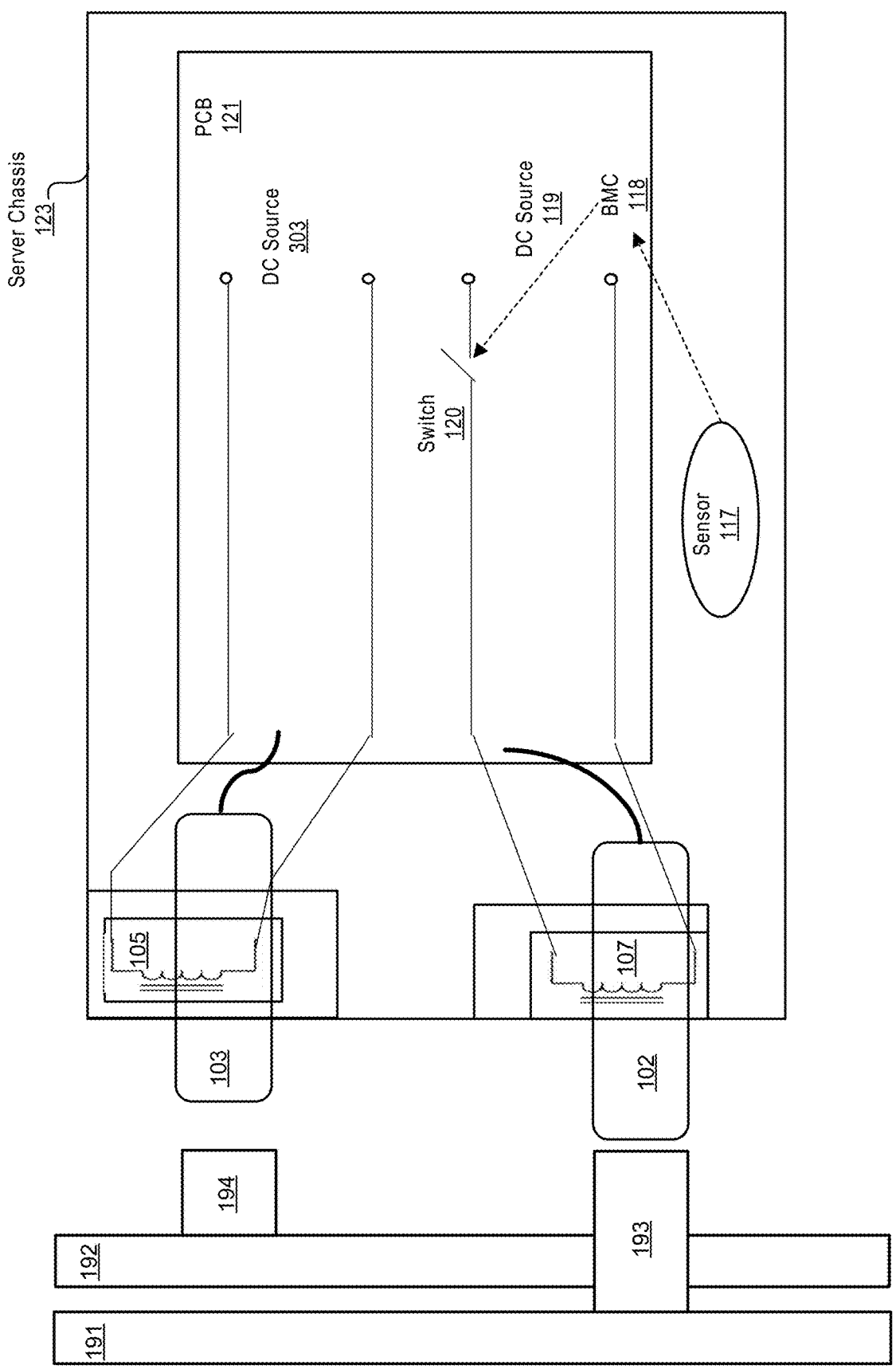
FIG. 3 illustrates another embodiment of the system for fluid leakage management.

FIG. 3 illustrates another embodiment of the system 100 for fluid leakage management. As shown, the system 101 does not include the energy storage unit 115 in FIG. 1. To compensate for the lacking of the energy storage unit 115, the PCB 121 includes an additional DC source 303 to power the electromagnet 105 on the return side.

As shown, the DC source 303 is not associated with a switch, a sensor, or any other control devices. The DC source 119, however, is controlled by the switch 120 based information collected by the leakage detection sensor 120. In one embodiment, the DC source 119 and the DC source 303 can be the result of one DC source being split. The DC source that is being split can be converted from an alternating current (AC) by an AC/DC converter.

In on embodiment, when a liquid leakage is detected, the electromagnet 105 is to be continuously powered by the DC source 303 to keep the return side fluid connector 103 to be engaged such that the leaked liquid can be cleaned up. When the cleaning-up is completed, the server chassis 123 or a particular server in the server chassis needs to be shut down to disengage the return side fluid connector 103 to prevent air from entering the server chassis 123 to cause pump cavitation.

In one embodiment, both the liquid leakage detection sensor 117 and the switch 120 can be connected to a baseboard management controller (BMC) 118 on the PCB 121. Through the BMC 118, through which the sensor 117 can control the switch 120.

Figure 4:
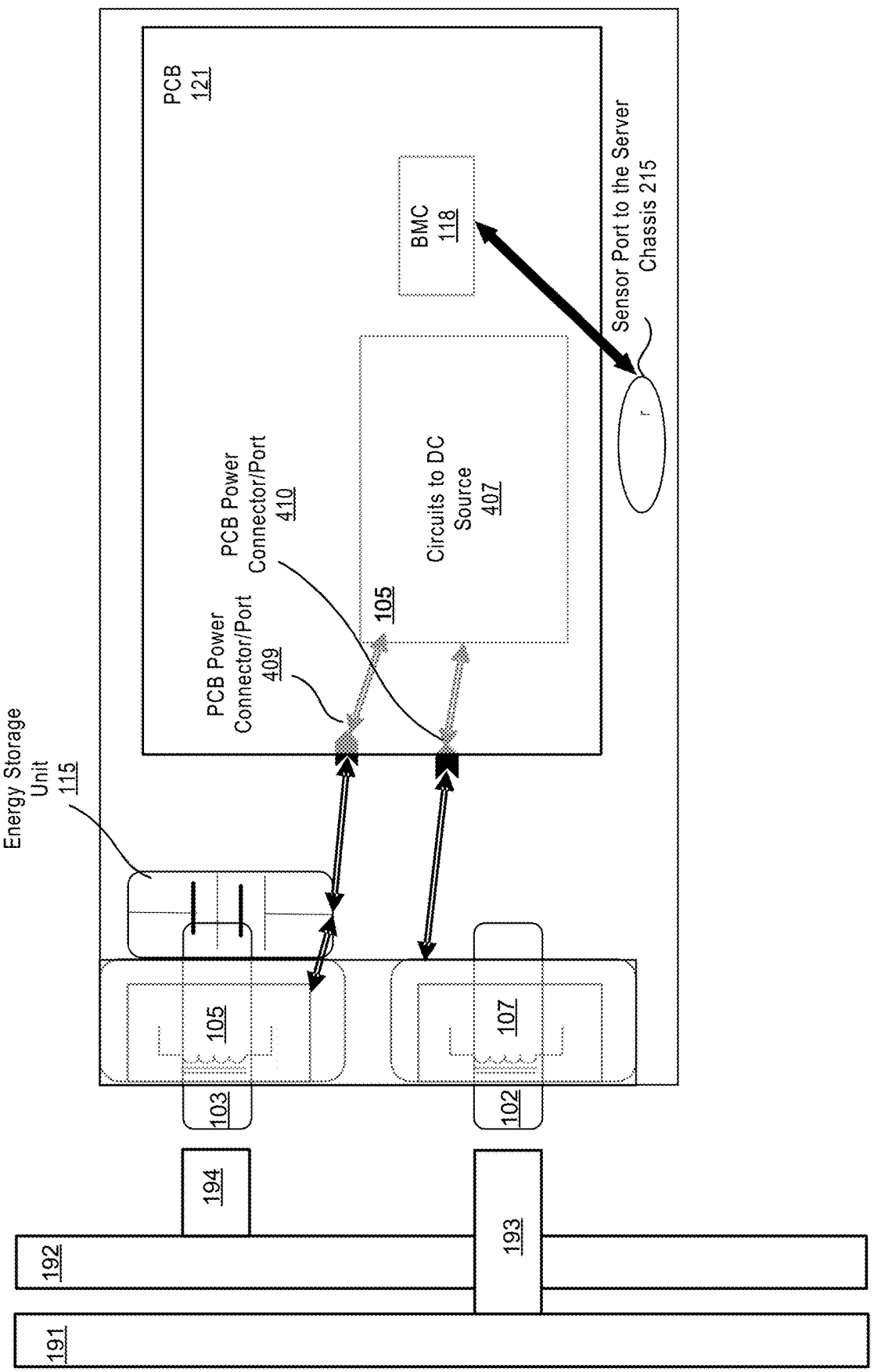
FIG. 4 illustrates another embodiment of the system for fluid leakage management.

FIG. 4 illustrates another embodiment of the system 100 for fluid leakage management. More specifically, FIG. 4 shows hardware features for controls and power supplies.

In one embodiment, a pair of PCB power connectors (i.e., ports) 409 and 410 are provided on the PCB 121. The PCB power connectors 409 and 410 can be used to connect the electromagnets 105 and 107 to one or more DC sources through a circuit 407.

With respect to the controls, the sensor port 215 can be a communication port used for connecting the fluid leakage detection sensor 117 to the server chassis 123 via the BMC 118.

Also in this embodiment, the energy storage unit 115 is provided as a separate module. Being an independent module, the energy storage unit 115 can be easily maintained and replaced for actual uses cases. For example, the energy storage unit may be replaced with one having a larger or smaller storage of power to satisfy design requirements in view of fluid pumping capability within the system 100 and/or different rack or system environments. The pump used to pump the leaked liquid can also be powered by the energy storage unit.

Figure 5:
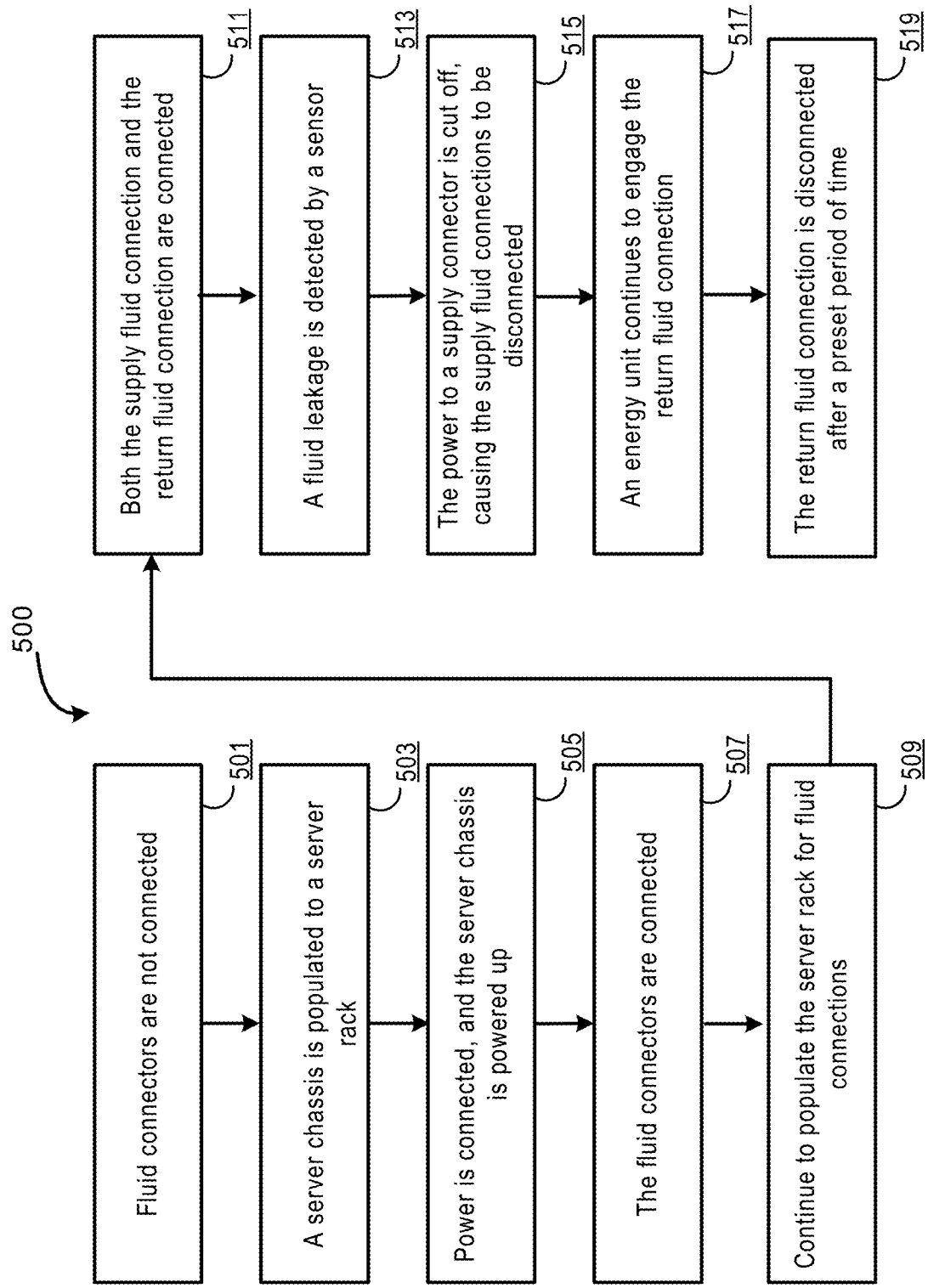
FIG. 5 shows a flow chart of a process of managing leakage management in a server chassis according to one embodiment.

FIG. 5 shows a flow chart of a process of managing leakage management in a server chassis according to one embodiment. The flow chart includes statuses of fluid connectors when populating a server to a server chassis, and during fluid leakage management. The flow chart shows a combination of synchronous and asynchronous operations.

As shown in FIG. 5, at block 501, a supply side fluid connector and a server side fluid connector are not connected to a server chassis yet. At block 503, the server chassis is populated to a server rack. At block 505, after the server chassis is populated to the sever rack, direct current DC sources are connected to the server chassis, and the server chassis is power up. At block 507, powering up the server chassis will cause an electric current to pass through two motion devices (e.g., electromagnets) that are coupled with the two fluid connectors to move horizontally towards the server chassis, thereby mating the fluid connectors with corresponding fluid connector interfaces on a cooling module in the server chassis. At block 509, the server rack is continued to be populated for fluid connections, including a supply fluid connection and a return fluid connection.

At block 511, both the supply connection and the return fluid connection are connected to the server chassis such that liquid coolant can be supplied to cool electronic components in the server chassis. At block 513, a leakage detection sensor detects a fluid leakage in the server chassis. At block 515, the leakage detection sensor can signal a power switch to cut off the DC sources of the two motion devices. At block 517, an energy storage unit continues to power the motion device on the return side for a period of time so that the return side fluid connector is continued to be engaged for the period of time. However, the supply side fluid connector is immediately disengaged when the DC source is cut off from the associated motion device. During the period of time, a pump that is powered by the energy storage unit can be turned on to pump the leaked liquid out of the server chassis through the return side fluid connection. At block 519, the energy storage unit is cut off from the return side motion device, causing the return side fluid connector to be disengaged, which can prevent air from entering the server chassis to cause pump cavitation.

Figure 6:
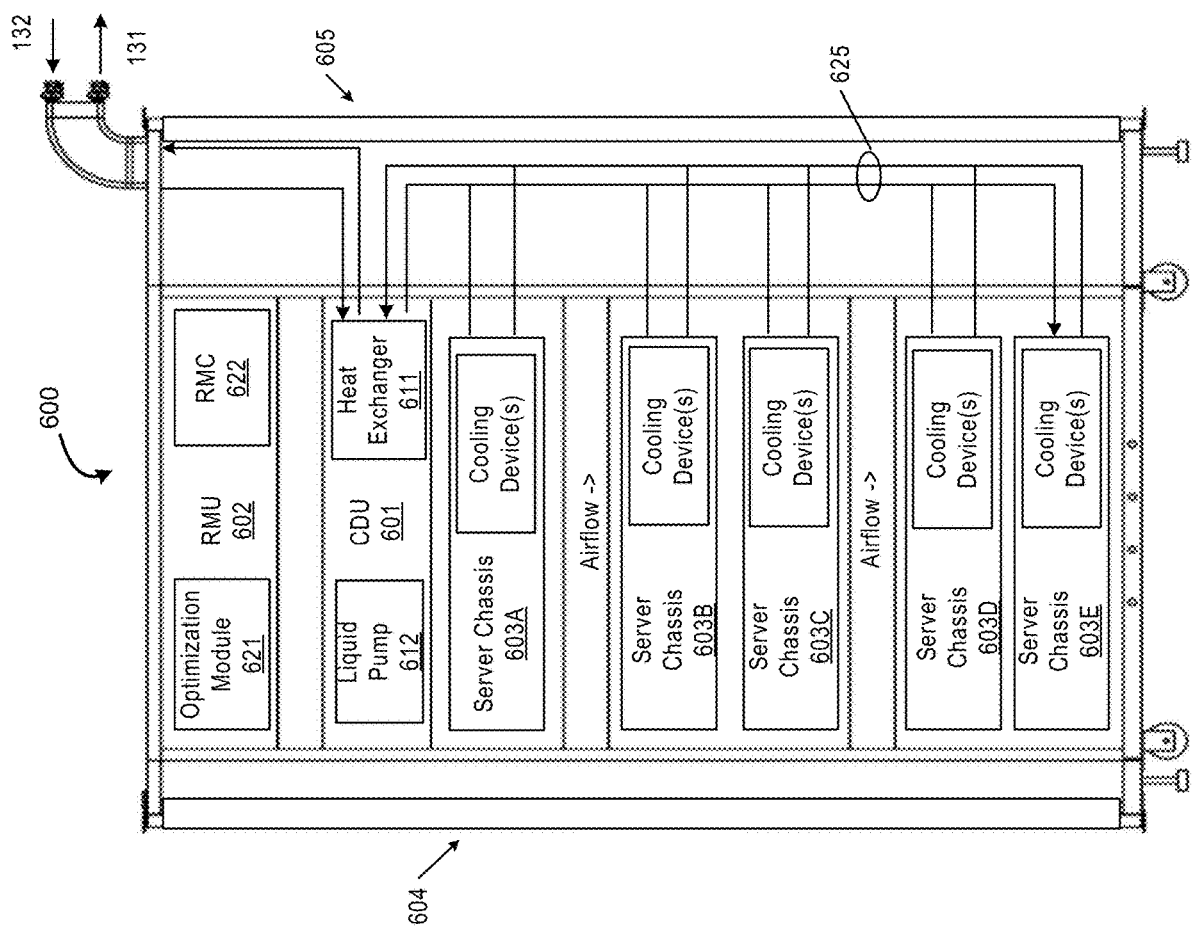
FIG. 6 is block diagram illustrating an electronic server rack according to one embodiment.

FIG. 6 is block diagram illustrating an electronic server rack according to one embodiment. Electronic server rack 600 may represent any of the electronic racks of a data center. Referring to FIG. 6, electronic rack 600 includes CDU 601, rack management unit (RMU) 602, and one or more server chassis 603A-603E (collectively referred to as server chassis 603). Server chassis 603 can be inserted into an array of server slots (e.g., standard shelves) respectively from frontend 604 or backend 605 of electronic rack 600. Server chassis 603 may represent any of the server chassis as described above, where each of server chassis 603 includes a fluid module as described above to connect and disconnect server connectors to and from rack connectors of rack manifolds 625.

In one embodiment, CDU 601 includes heat exchanger 611, liquid pump 612, and a pump controller (not shown), and some other components such as a liquid reservoir, a power supply, monitoring sensors and so on. Heat exchanger 611 may be a liquid-to-liquid heat exchanger, and includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 605 of electronic rack 600. The liquid supply/return lines 131-132, also referred to as room liquid supply/return lines, may be coupled to an external cooling system (e.g., a data center room cooling system).

In addition, heat exchanger 611 further includes a second loop with two ports having a second pair of liquid connectors coupled to liquid manifold 625 (also referred to as a rack manifold including a supply rack manifold and a return rack manifold) to form a secondary loop, which may include a supply manifold (also referred to as a rack liquid supply line or rack supply manifold) to supply cooling liquid to server chassis 603 and a return manifold (also referred to as a rack liquid return line or rack return manifold) to return warmer liquid back to CDU 601.

Each of server chassis 603 may include one or more IT components (e.g., central processing units or CPUs, general/graphic processing units (GPUs), memory, and/or storage devices). Server chassis 603 may include a host server (referred to as a host node) coupled to one or more compute servers (also referred to as computing nodes, such as CPU server and GPU server).

Electronic rack 600 further includes optional RMU 602 configured to provide and manage power supplied to servers 603, and CDU 601. RMU 602 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 600.

In one embodiment, RMU 602 includes optimization module 621 and rack management controller (RMC) 622. RMC 622 may include a monitor to monitor operating status of various components within electronic rack 600, such as, for example, computing nodes 603, CDU 601, and the fan modules. Specifically, the monitor receives operating data from various sensors representing the operating environments of electronic rack 600. For example, the monitor may receive operating data representing temperatures of the processors, cooling liquid, and airflows, which may be captured and collected via various temperature sensors. The monitor may also receive data representing the fan power and pump power generated by the fan modules and liquid pump 612, which may be proportional to their respective speeds. These operating data are referred to as real-time operating data.

Based on the operating data, optimization module 621 performs an optimization using a predetermined optimization function or optimization model to derive a set of optimal fan speeds for the fan modules and an optimal pump speed for liquid pump 612, such that the total power consumption of liquid pump 612 and the fan modules reaches minimum, while the operating data associated with liquid pump 612 and cooling fans of the fan modules are within their respective designed specifications. Once the optimal pump speed and optimal fan speeds have been determined, RMC 622 configures liquid pump 612 and cooling fans of the fan modules based on the optimal pump speeds and fan speeds.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

As previously explained, an embodiment of the disclosure may be (or include) a non-transitory machine-readable medium (such as microelectronic memory) having stored thereon instructions, which program one or more data processing components (generically referred to here as a "processor") to perform airflow management operations, such as controlling fan speed of one or more fans of the battery module (and/or BBU shelf). In other embodiments, some of these operations might be performed by specific hardware components that contain hardwired logic. Those operations might alternatively be performed by any combination of programmed data processing components and fixed hardwired circuit components of any of the battery modules described herein.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

What is claimed is:

1. A system for managing liquid leakage in a server chassis, comprising:
    a fluid module, including
        a first fluid connector to receive cooling fluid from a supply rack manifold coupled to an external fluid source and to supply the cooling fluid to an information technology (IT) load of the server chassis, and
        a second fluid connector to receive cooling fluid from the IT load of the server chassis and to return the cooling fluid to a return rack manifold and then to the external fluid source, forming a fluid loop;
    an electromagnetic unit coupled to the first and second fluid connectors, and in communication with control circuitry for the electromagnetic unit, wherein the control circuitry is configured to provide power to the electromagnetic unit; and
    a sensor coupled to the server chassis and the control circuitry for the electromagnetic unit, wherein the sensor is configured to detect a liquid leakage from the fluid loop in the server chassis,
    wherein in response to detecting the liquid leakage, the sensor is caused to control the control circuitry to control the electromagnetic unit to thereby cause the first fluid connector to be pushed away from the supply rack manifold to disconnect the fluid loop on a supply side, and the electromagnetic unit is further controlled to cause the second fluid connector to be disconnected from the return rack manifold on a return side after a predetermined period of time as determined by the control circuitry after the first fluid connector has been disconnected.

2. The system of claim 1, wherein the electromagnetic unit comprises:
    a first electromagnetic device coupled to the first fluid connector;
    a second electromagnetic device coupled to the second fluid connector;
    wherein each of the first electromagnetic device and the second electromagnetic device is to push its corresponding fluid connector towards or away from the supply rack manifolds individually based on whether the respective electromagnetic device is being powered.

3. The system of claim 2, wherein in response to the sensor detecting the liquid leakage, the control circuitry is controlled by the sensor to cut off the first electromagnetic device from a direct current (DC) source to cause the first fluid connector to be pushed away, due to loss of magnetic force, from the supply rack manifold to disconnect the fluid loop on the supply side, and the second electromagnetic device continues to be powered to keep the second fluid connector connected to the return rack manifold on the return side for the predetermined period of time.

4. The system of claim 3, wherein the control circuitry comprises at least:
    an energy storage unit coupled to the DC source, wherein the DC source is to recharge the energy storage unit when the DC source is connected to the fluid module;
    wherein the second electromagnetic device continuing to be powered includes the second electromagnetic device being powered by the energy storage unit to keep the second fluid connector connected to the server chassis on the return side for the predetermined period of time.

5. The system of claim 4, wherein the fluid module further includes a first connector holder, and a second connector holder, wherein the first connector holder holds the first electromagnetic device and the first fluid connector, and the second connector holder holds the second electromagnetic device, the second fluid connector, and the energy storage unit.

6. The system of claim 2, wherein the fluid module further includes an energy storage unit as a separate energy storage unit.

7. The system of claim 2, wherein the first electromagnetic device and the second electromagnetic device are powered by a same DC source.

8. The system of claim 2, wherein each of the first electromagnetic device and the second electromagnetic device is powered by a different DC source, wherein the control circuitry includes at least a switch to switch on and off the DC source that powers the first electromagnetic device, and wherein the DC source that powers the second electromagnetic devices is not controllable by the switch.

9. The system of claim 8, wherein the sensor is coupled to the server chassis via a communication port, wherein the sensor is to control the switch via a baseboard management controller (BMC).

10. The system of claim 2, wherein each of the first electromagnetic device and the second electromagnetic device comprises an electromagnet.

11. The system of claim 1, wherein the server chassis includes a cooling module with a first connector interface and a second connector interface, which are connected with the first fluid connector and the second fluid connector respectively.

12. The system of claim 1, wherein each of the first fluid connector and the second fluid connector is a blind mating connector.

13. The system of claim 1, wherein the server chassis includes a power interface configured to be mated with a power interface of the fluid module, wherein the power interface of the fluid module is a blind mating connector.

14. A server rack, comprising:
a supply rack manifold to receive cooling fluid from an external fluid source;
a return rack manifold to return the cooling fluid to the external fluid source; and
a plurality of server chassis, wherein each of the plurality of server chassis includes:
   a fluid module, including
      a first fluid connector to receive the cooling fluid from the supply rack manifold and to supply the cooling fluid to an information technology (IT) load of the server chassis, and
      a second fluid connector to receive cooling fluid from the IT load of the server chassis and to return the cooling fluid to the return rack manifold and then to the external fluid source, forming a fluid loop;
   an electromagnetic unit coupled to the first and second fluid connectors, and in communication with control circuitry for the electromagnetic unit, wherein the control circuitry is configured to provide power to the electromagnetic unit; and
   a sensor coupled to the server chassis and the control circuitry for the electromagnetic unit, wherein the sensor is configured to detect a liquid leakage from the fluid loop in the server chassis,
   wherein in response to detecting the liquid leakage, the sensor is caused to control the control circuitry to control the electromagnetic unit to thereby cause the first fluid connector to be pushed away from the supply rack manifold to disconnect the fluid loop on a supply side, and the electromagnetic unit is further controlled to cause the second fluid connector to be disconnected from the return rack manifold on a return side after a predetermined period of time as determined by the control circuitry after the first fluid connector has been disconnected.

15. The server rack of claim 14, wherein each server chassis further comprises:
a first electromagnetic device coupled to the first fluid connector,
a second electromagnetic device coupled to the second fluid connector,
wherein each of the first electromagnetic device and the second electromagnetic device is to push its corresponding fluid connector horizontally towards or away from the supply rack manifold and return rack manifold respectively based on whether that motion device is being powered.

16. The server rack of claim 15, wherein in response to the sensor detecting the liquid leakage, the control circuitry is controlled by the sensor to cut off the first electromagnetic device from a direct current (DC) source to cause the first fluid connector to be pushed away, due to loss of magnetic force, from the supply rack manifold to disconnect the fluid loop on the supply side, and the second electromagnetic device continues to be powered to keep the second fluid connector connected to the server chassis on the return side for the predetermined period of time.

17. The server rack of claim 16, wherein the control circuitry comprises at least:
an energy storage unit coupled to the DC source, wherein the DC source is to recharge the energy storage unit when the DC source is connected to the fluid module;
wherein the second electromagnetic device continuing to be powered includes the second electromagnetic device being powered by the energy storage unit to keep the second fluid connector connected to the server chassis on the return side for the predetermined period of time.

18. The server rack of claim 17, wherein the fluid module further includes a first connector holder, and a second connector holder, wherein the first connector holder holds the first electromagnetic device and the first fluid connector, and the second connector holder holds the second electromagnetic device, the second fluid connector, and the energy storage unit.

19. The server rack of claim 15, wherein the fluid module further includes an energy storage unit as a separate energy storage unit.

20. The server rack of claim 15, wherein the first electromagnetic device and the second electromagnetic device are powered by a same DC source.

* * * * *